(12) United States Patent
Lee

(10) Patent No.: US 7,714,755 B2
(45) Date of Patent: May 11, 2010

(54) DYNAMIC BIAS CONTROL CIRCUIT AND RELATED APPARATUS FOR DIGITAL-TO-ANALOG CONVERTERS

(75) Inventor: Ming-Han Lee, Taipei Hsien (TW)

(73) Assignee: Realtek Semiconductor Corp., HsinChu (TW)

( * ) Notice: Subject to any disclaimer, the term of this patent is extended or adjusted under 35 U.S.C. 154(b) by 391 days.

(21) Appl. No.: 11/836,771

(22) Filed: Aug. 9, 2007

(65) Prior Publication Data
US 2008/0043735 A1    Feb. 21, 2008

(30) Foreign Application Priority Data
Aug. 15, 2006    (TW) .................................. 095129906

(51) Int. Cl.
*H03M 1/66* (2006.01)
(52) U.S. Cl. ........................ 341/136; 341/144; 323/316
(58) Field of Classification Search ................ 341/135, 341/136, 144; 323/316, 317
See application file for complete search history.

(56) References Cited

U.S. PATENT DOCUMENTS

| | | | | |
|---|---|---|---|---|
| 6,518,906 B2 * | 2/2003 | Abel et al. | .................. | 341/144 |
| 6,646,580 B2 * | 11/2003 | Clara et al. | .................. | 341/136 |
| 6,650,265 B1 * | 11/2003 | Bugeja | ........................ | 341/144 |
| 6,674,382 B1 * | 1/2004 | Jordan | ........................ | 341/144 |
| 6,759,975 B1 * | 7/2004 | Lee et al. | ..................... | 341/144 |
| 7,095,351 B2 * | 8/2006 | Kirby et al. | .................. | 341/154 |

* cited by examiner

*Primary Examiner*—Howard Williams
(74) *Attorney, Agent, or Firm*—Winston Hsu

(57) ABSTRACT

A dynamic bias control circuit includes a current source, a first switch, a differential amplifier, and a third switch. The current source outputs a first current. The first switch is coupled to an output end of the current source for generating the first current. The differential amplifier includes a first input end for receiving a reference voltage and a second input end coupled to the first switch. The third switch is coupled to an output end of the differential amplifier and to the first end of the first switch for adjusting a voltage at the first end of the first switch according to a result outputted from the differential amplifier. A control end of the first switch is coupled to a second switch. The second switch is used for inputting a second current into the second switch, wherein the second current to the first current is a predetermined ratio.

19 Claims, 3 Drawing Sheets

DYNAMIC BIAS CONTROL CIRCUIT AND RELATED APPARATUS FOR DIGITAL-TO-ANALOG CONVERTERS

BACKGROUND OF THE INVENTION

1. Field of the Invention

The present invention relates to a dynamic bias control circuit for a digital-to-analog converter, and more particularly, to a dynamic bias control circuit utilizing a differential amplifier for dynamic adjustment.

2. Description of the Prior Art

Conventionally, a digital-to-analog converter of a 10/100 high-speed chip includes a plurality set of switching current sources. For example, twenty sets, forty sets, or sixty sets of switching current sources are coupled together in parallel. Referring to partial circuits of a conventional high-speed network chip, the high-speed network chip includes a digital-to-analog converter and a switching current source. With improvements in integrated circuit manufacturing, the supply voltage terminal $V_{DD}$ decreases. In 0.18 μm manufacturing, the supply voltage terminal $V_{DD}$ can be assumed to be 1.8V. In this situation, the value of the first output voltage terminal Vout1 will fall between $(V_{DD}-1.25)$ and $(V_{DD}+1.25)$, where there is only a difference of 550 mV between the ground and the lowest voltage, and which results in compressing the switching current source below entering the triode region. As a result, the current provided by the current source becomes smaller and the amplitude of output signals descends. As the supply voltage terminal $V_{DD}$ becomes lower, the above mentioned phenomenon becomes more serious.

In order to solve the above-mentioned problem, areas of current cells are increased to lower their saturation drain voltage (Vdsat) so that it is more difficult for the current cells to enter the triode region. Nevertheless, it is not beneficial in cost if the element areas of tens of switching current source are increased simultaneously.

SUMMARY OF THE INVENTION

It is therefore an objective of the present invention to provide a dynamic bias control circuit for a digital-to-analog converter utilizing a differential amplifier to adjust currents dynamically without increasing areas of current cells to solve the above-mentioned problems.

A dynamic bias control circuit for a digital-to-analog converter is disclosed in the present invention. The dynamic bias control circuit includes a current source, a first switch, a differential amplifier, and a third switch. The current source is used for outputting a first current. The first switch is coupled to an output end of the current source for generating the first current. The differential amplifier includes a first input end for receiving a reference voltage and a second input end coupled to the first end of the first switch. The third switch is coupled to an output end of the differential amplifier and the first end of the first switch for adjusting a voltage at the first end of the first switch according to a result outputted from the differential amplifier. A control end of the first switch is coupled to a second switch. The second switch is used for inputting a second current into the second switch, wherein the second current to the first current is a predetermined ratio.

A high-speed network chip is disclosed in the present invention. The high-speed network chip includes a dynamic bias control circuit and a digital-to-analog converting circuit. The dynamic bias control circuit includes a current source, a first switch, a differential amplifier, and a third switch. The current source is used for outputting a first current. The first switch is coupled to an output end of the current source for generating the first current. The differential amplifier includes a first input end for receiving a reference voltage and a second input end coupled to the first end of the first switch. The third switch is coupled to an output end of the differential amplifier and the first end of the first switch for adjusting a voltage at the first end of the first switch according to a result outputted from the differential amplifier. The digital-to-analog converting circuit includes a fourth switch and a fifth switch. The control end of the first switch is coupled to a control end of a second switch, a second end of the fourth switch is coupled to a first end of the second switch, and a second end of the fifth switch is coupled to the first end of the second switch. The second switch is used for inputting a second current into the second switch, wherein the second current to the first current is a predetermined ratio.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
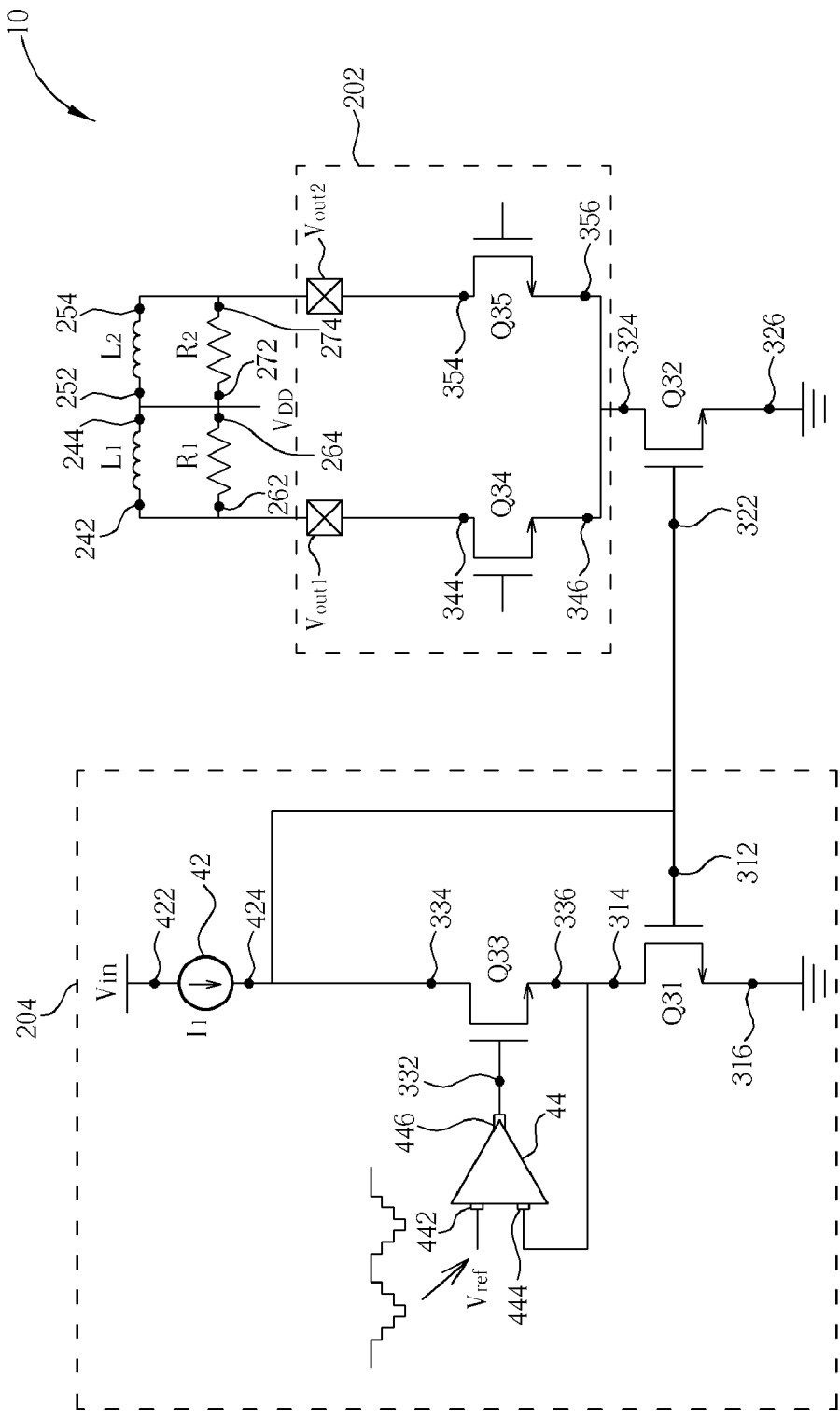
FIG. 1 is a diagram of partial circuits of a high-speed network chip according to an embodiment of the present invention.

Please refer to FIG. 1. FIG. 1 is a diagram of partial circuits of a high-speed network chip 10 according to an embodiment of the present invention. The high-speed network chip 10 includes a digital-to-analog converter (DAC) 202 of the present invention and a bias control circuit 204. The bias control circuit 204 includes a current source 42, a first switch Q31, a differential amplifier 44, and a third switch Q33. An input end 422 of the current source 42 is coupled to a voltage input terminal Vin. The current source 42 is used for outputting a first current $I_1$. The first switch Q31 includes a control end 312 coupled to an output end 424 of the current source 42 for generating the first current $I_1$, a first end 314, and a second end 316 coupled to ground. The high-speed network chip 10 further includes a current cell of the digital-to-analog converter 202 and a second switch Q32. The second switch Q32 includes a control end 322 coupled to the control end 312 of the first switch Q31, a first end 324, and second end 326 coupled to ground for inputting a current having a value equal to 2.5 times the value of the first current $I_1$ into the second switch Q32. The differential amplifier 44 has a first input end 442 for receiving a reference voltage Vref determined by digital coding, and a second input end 444 coupled to the first end 314 of the first switch Q31. The third switch Q33 includes a control end 332 coupled to an output end 446 of the differential amplifier 44, a first end 334 coupled to the output end 424 of the current source 42, and a second end 336 coupled to the first end 314 of the first switch Q31. The third switch Q33 is used for adjusting a control end 332 of the third switch Q33 to make a voltage of the first end 314 of the first switch Q31 equal the voltage value of the reference voltage Vref according to a result outputted from the differential amplifier 44. The first switch Q31 and the second switch Q32 are two transistors of a current mirror circuit. The current source 42, the first switch Q31, the differential amplifier 44, and the third switch Q33 construct the bias control circuit of the digital-to-analog converter 202.

Please continue referring to FIG. 1, the digital-to-analog converter 202 includes a fourth switch Q34 and a fifth switch Q35. The fourth switch Q34 has a first end 344 coupled to a first output voltage terminal Vout1, and a second end 346 coupled to the first end 324 of the second switch Q32. The fifth switch Q35 has a first end 354 coupled to a second output voltage terminal Vout2, and a second end 356 coupled to the first end 324 of the second switch Q32. The high-speed network chip 10 further includes a first inductor $L_1$, a second inductor $L_2$, a first resistor $R_1$, and second resistor $R_2$, where these elements are equivalent circuits of network lines and PCB transformers for circuit simulation. The first inductor $L_1$ includes a first end 242 coupled to the first output voltage terminal Vout1, and the second inductor $L_2$ includes a first end 252 coupled to a second end 244 of the first inductor $L_1$ and to a supply voltage terminal $V_{DD}$, and a second end 254 coupled to the second output voltage terminal Vout2. The first resistor $R_1$ has a first end 262 coupled to the first output voltage terminal Vout1, and the second resistor $R_2$ has a first end 272 coupled to a second end 264 of the first resistor $R_1$ and to the supply voltage terminal $V_{DD}$, and a second end 274 coupled to the second output voltage terminal Vout2. The first switch Q31, the second switch Q32, the third switch Q33, the fourth switch Q34, and the fifth switch Q35 can be a N type metal-oxide semiconductor transistor each (NMOS) or an NPN bipolar junction transistor (BJT) each.

Figure 2:
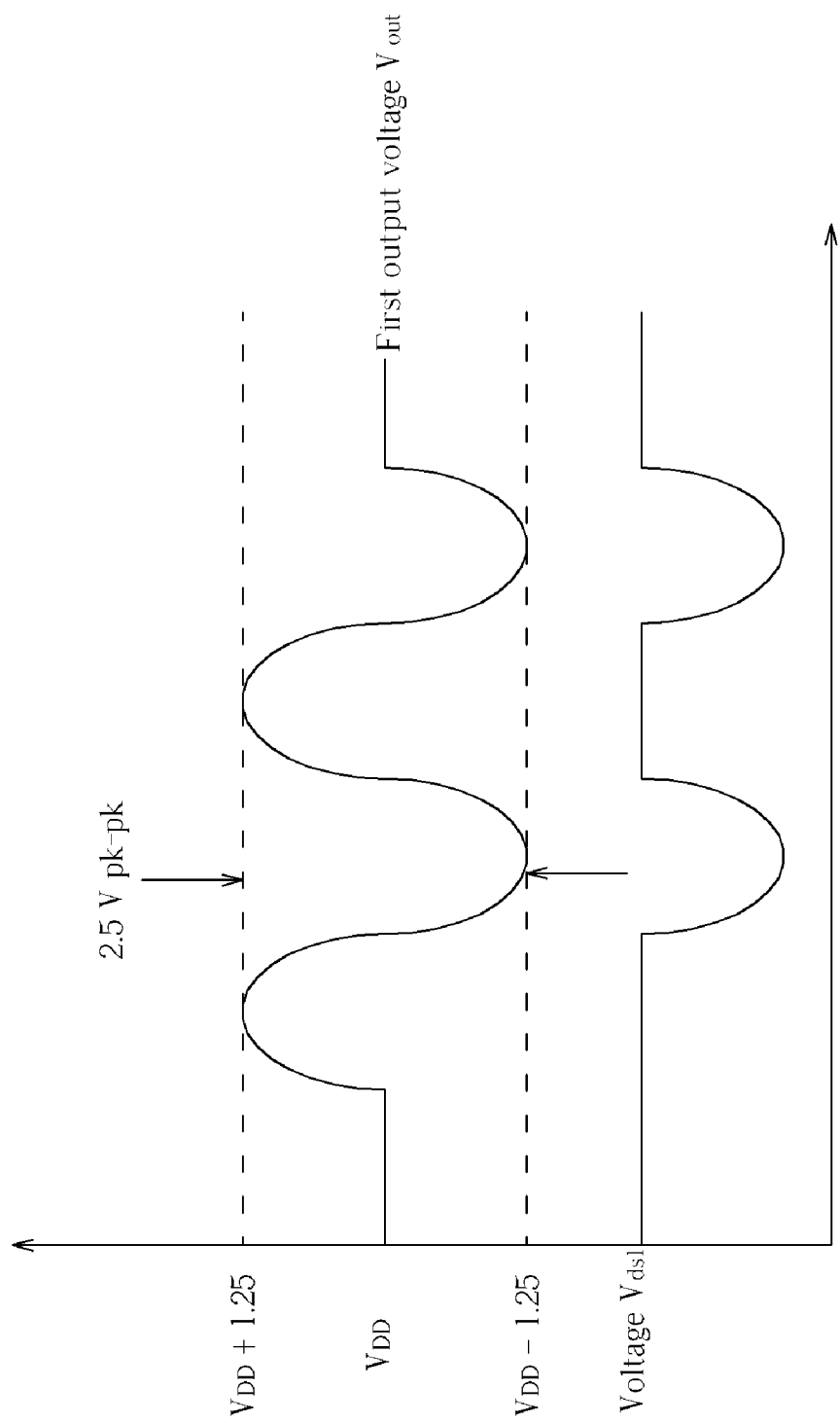
FIG. 2 is a diagram of the waveforms of the first output voltage terminal and the voltage Vds1 in FIG. 1.

Please refer to FIG. 2, which is a diagram of the waveforms of the first output voltage terminal Vout1 and the voltage Vds1 in FIG. 1. The voltage Vds1 is a voltage of the first end 314 of the first switch Q31. The first output voltage terminal Vout1 has a center point of $V_{DD}$ and an amplitude of signal swing between ($V_{DD}$−1.25) and ($V_{DD}$+1.25) if a voltage signal of the digital-to-analog converter 202 needs to reach a peak-to-peak value of 5V. As integrated circuit manufacturing improves, the supply voltage terminal $V_{DD}$ decreases. Thus, if the supply voltage terminal $V_{DD}$ is 1.8V, as shown in FIG. 2, the value of the first output voltage terminal Vout1 will fall between ($V_{DD}$−1.25) and ($V_{DD}$+1.25), which has a difference 550 mV between the ground GND.

Please keep referring to FIG. 2 and FIG. 1. The gate voltage 332 of the third switch Q33 is adjusted to control the voltage Vds1 of the first end 314 of the first switch Q31 to assure the first switch Q31 to work in a triode region by utilizing the differential amplifier 44 due to its input end 442 being used for receiving the reference voltage Vref determined by the digital coding. Due to the first switch Q31 and the second switch Q32 being two transistors of a current mirror circuit, the current value flow into the second switch Q32 will be fixed to 2.5 times of the first current $I_1$. Please note that, in this embodiment, the ratio of the current value flow into the second switch Q32 to the first current $I_1$ flow into the first switch Q31 is 1:2.5 which is merely an embodiment for illustration and is not limited to a scope of the present invention.

Figure 3:
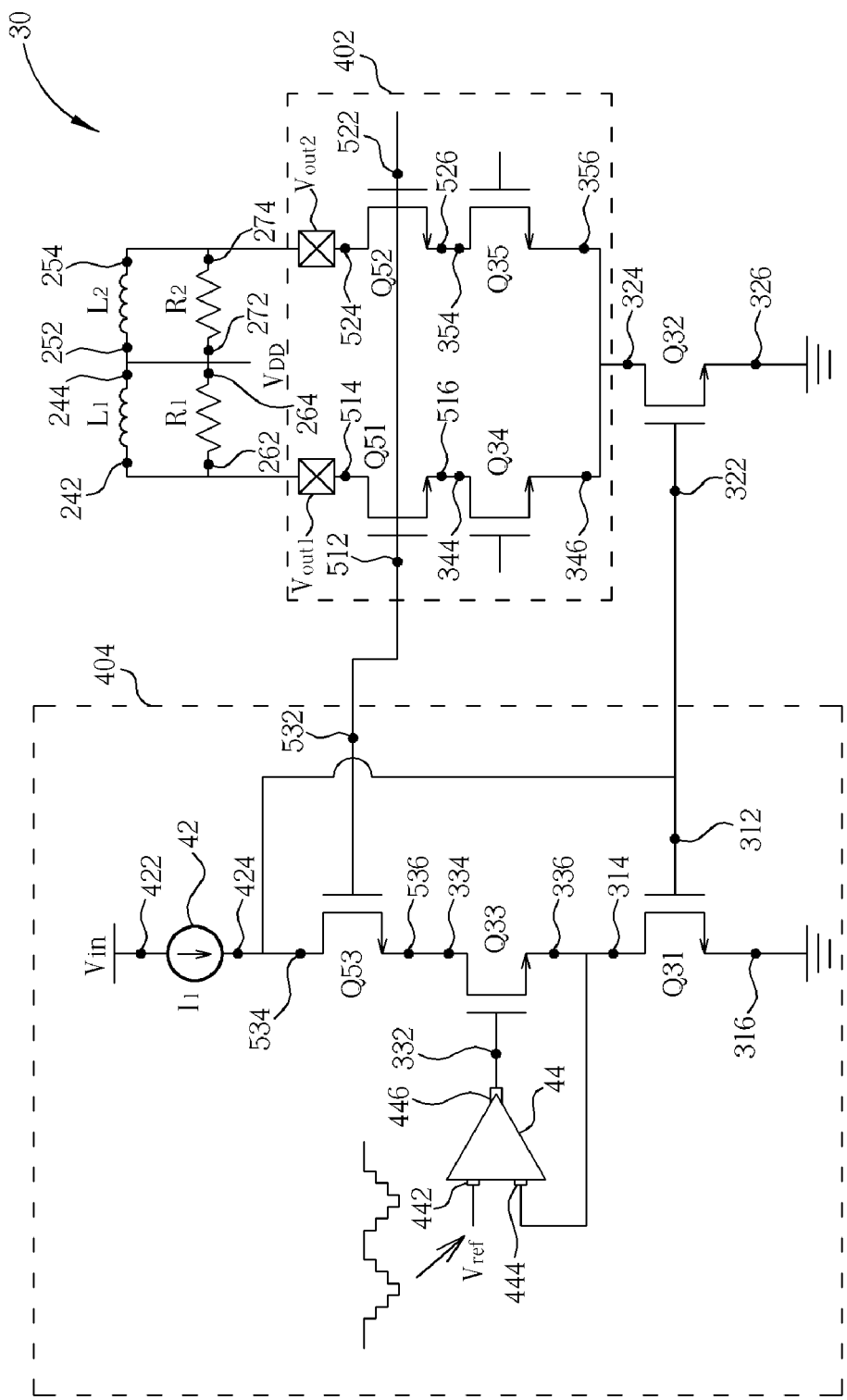
FIG. 3 is a diagram of partial circuits of a high-speed network chip according to another embodiment of the present invention.

Please refer to FIG. 3. FIG. 3 is a diagram of partial circuits of a high-speed network chip 30 according to a second embodiment of the present invention. The difference between the high-speed network chip 30 and the high-speed network chip 10 is that the high-speed network chip 30 further cascades one class circuit. A digital-to-analog converter 402 further includes a sixth switch Q51 and a seventh switch Q52. A bias control circuit 404 further includes an eighth switch Q53. The sixth switch Q51 has a control end 512 coupled to a control end 532 of the eighth switch Q53, a first end 514 coupled to the first output voltage Vout1, and a second end 516 coupled to the first end 344 of the fourth switch Q34. The seventh switch Q52 includes a control end 522 coupled to the control end 532 of the eighth switch Q53, a first end 524 coupled to the second output voltage terminal Vout2, and a second end 526 coupled to the first end 354 of the fifth switch Q35. The eighth switch Q53 includes a first end 534 coupled to the output end 424 of the current source 42, and a second end 536 coupled to the first end 334 of the third switch Q33.

Please keep referring to FIG. 1 and FIG. 3. The second switch Q32 is forced to enter the triode region caused by too small of a voltage when the reference voltage Vref changes due to two input ends of the differential amplifier 44 being used for receiving the reference voltage Vref and the voltage of the first end 314 of the first switch Q31. At this time, the differential amplifier 44 will adjust the voltage of the control end 332 of the third switch Q33 and then control the voltage of the first end 314 of the first switch Q31 to make the first switch Q31 work in the triode region and to make the voltage of the first end 314 of the first switch Q31 similar to the voltage of the first end 324 of the second switch Q32. If the current flow into the first switch Q31 is maintained at the first current $I_1$, the current flow into the second switch Q32 will be fixed to 2.5 times of the first current $I_1$ due to all voltages at three terminals of the first switch Q31 and the second switch Q32 being the same. Therefore, currents of the digital-to-analog converter 202 and the digital-to-analog converter 402 can be maintained.

The abovementioned embodiments are presented merely for describing the present invention, and in no way should be considered to be limitations of the scope of the present invention. The above-mentioned switches are not limited to N type metal-oxide semiconductor transistors (NMOS) and NPN bipolar junction transistors (BJT) only, and can be replaced by other elements. The high-speed network chip 10 and the high-speed network chip 30 are merely used for describing the present invention and should not be limited only to embodiments disclosed in the present application. The ratio of the current value flow into the second switch Q32 to the first current $I_1$ flow into the first switch Q31 is 1:2.5 which is merely an embodiment for illustration and is not to limit the scope of the present invention. Furthermore, the position of the third switch Q33 is not necessary to be placed at the output end of the differential amplifier 44 and can be placed at other positions, for example, the second input end of the differential amplifier 44 which changes with the reference voltage Vref.

From the above descriptions, the present invention provides a digital-to-analog converter capable of adjusting currents dynamically. The voltages of the first switch Q31 and the third switch Q33 are adjusted with the change of the reference voltage Vref by utilizing the differential amplifier 44 to monitor the change of the reference voltage Vref determined by the digital coding. In this situation, the first switch Q31 will work in the triode region temporarily in a specific duration and keep the current of the second switch the same. Not only can effects of dynamically adjusting currents be reached easily, but also areas of current cells are not necessary increased to save more cost through the present invention. Moreover, the reference voltage Vref determined by the digital coding is included in the high-speed network chip 10 and the high-speed network chip 30 and does not need to be obtained in any other fashion.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A dynamic bias control circuit for a digital-to-analog converter comprising:
   a current source used for outputting a first current;
   a first switch having a control end coupled to an output end of the current source for generating the first current;
   a differential amplifier having a first input end for receiving a reference voltage and a second input end coupled to a first end of the first switch, wherein the reference voltage is determined according to a digital coding; and
   a third switch coupled between an output end of the differential amplifier and the first switch for adjusting voltages of the first end of the first switch according to a result outputted by the differential amplifier;
   wherein the control end of the first switch is coupled to a second switch used for inputting a second current into the second switch, and the second current to the first current is a predetermined ratio.

2. The dynamic bias control circuit of claim 1 wherein the first switch and the second switch are two transistors of a current mirror circuit.

3. The dynamic bias control circuit of claim 1 wherein a second end of the first switch is coupled to ground.

4. The dynamic bias control circuit of claim 1 wherein a second end of the second switch is coupled to ground.

5. The dynamic bias control circuit of claim 1 wherein an input end of the current source is coupled to a voltage input terminal.

6. The dynamic bias control circuit of claim 1 wherein the third switch is a transistor having a control end coupled to an output end of the differential amplifier, a first end coupled to the current source, and a second end coupled to the first end of the first switch.

7. The dynamic bias control circuit of claim 1 wherein the first switch, the second switch, and the third switch are each an N type metal-oxide semiconductor transistor (NMOS).

8. The dynamic bias control circuit of claim 1 wherein the first switch, the second switch, and the third switch are each an NPN bipolar junction transistor (BJT).

9. The dynamic bias control circuit of claim 1 wherein the second switch is a current cell.

10. A high-speed network chip comprising:
    a dynamic bias control circuit, the dynamic bias control circuit comprising:
       a current source used for outputting a first current;
       a first switch having a control end coupled to an output end of the current source for generating the first current;
       a differential amplifier having a first input end for receiving a reference voltage and a second input end coupled to a first end of the first switch; and
       a third switch coupled between an output end of the differential amplifier and the first switch for adjusting voltages of the first end of the first switch according to a result outputted by the differential amplifier; and
    a digital-to-analog converting circuit, the digital-to-analog converting circuit comprising:
       a fourth switch; and
       a fifth switch;
    wherein the control end of the first switch is coupled to a control end of a second switch, a second end of the fourth switch is coupled to a first end of the second switch, a second end of the fifth switch is coupled to the first end of the second switch, and the second switch is used for inputting a second current, and the second current to the first current is a predetermined ratio.

11. The high-speed network chip of claim 10 wherein the first switch and the second switch are two transistors of a current mirror circuit.

12. The high-speed network chip of claim 10 wherein a second end of the first switch is coupled to ground.

13. The high-speed network chip of claim 10 wherein a second end of the second switch is coupled to ground.

14. The high-speed network chip of claim 10 wherein an input end of the current source is coupled to a voltage input terminal.

15. The high-speed network chip of claim 10 wherein the third switch is a transistor having a control end coupled to an output end of the differential amplifier, a first end coupled to the current source, and a second end coupled to the first end of the first switch.

16. The high-speed network chip of claim 10 wherein the first switch, the second switch, the third switch, the fourth switch, and the fifth switch are each an N type metal-oxide semiconductor transistor (NMOS).

17. The high-speed network chip of claim 10 wherein the first switch, the second switch, the third switch, the fourth switch, and the fifth switch are each an NPN bipolar junction transistor (BJT).

18. The high-speed network chip of claim 10 wherein the reference voltage is determined according to a digital coding.

19. The high-speed network chip of claim 10 wherein the second switch is a current cell.

* * * * *